United States Patent [19]

Pavlic et al.

[11] Patent Number: 5,130,664
[45] Date of Patent: Jul. 14, 1992

[54] ONE GHZ CATV REPEATER STATION

[75] Inventors: John C. Pavlic, Pleasant Gap; Donald A. Heaton, Huntingdon; Samuel H. Stitzer, Centre Hall, all of Pa.

[73] Assignee: C-COR Electronics, Inc., State College, Pa.

[21] Appl. No.: 665,820

[22] Filed: Mar. 7, 1991

[51] Int. Cl.[5] .......................... H03F 3/60; H03F 3/26
[52] U.S. Cl. ........................................ 330/55; 358/86
[58] Field of Search ................ 330/53, 54, 55, 150, 330/302, 310, 286, 262; 358/86, 184

[56] References Cited

U.S. PATENT DOCUMENTS 4,920,533 4/1990 Dufresne et al. ................ 358/86 X Primary Examiner—Steven Mottola
Attorney, Agent, or Firm—Stanley J. Price, Jr.

[57] ABSTRACT

An apparatus for and a method of RF amplification of signals up to 1 GHz. The apparatus, known as a repeater station, is for use in Community Antenna TeleVision transmission (CATV). The RF amplification (gain) stage includes two multitransistor distributed amplifier stages connected in a push-pull configuration. Each distributed amplifier includes four transistors connected to produce two-each cascode circuits. The distributed amplifier stages are operated in push-pull configuration by means of a 180° phase shifting power splitter. The push-pull configuration of the distributed amplifier operates in combination with the 180° phase shifting power splitter to cancel the 2IM distortion created within the distributed amplifiers, and to double the output capability of a single distributed amplifier. By installing very linear cascode connected transistors in the distributed amplifier, CATV operators can effectively double the basic circuit output capability and at the same time maximize RF bandwidth achievable with a given transistor.

20 Claims, 4 Drawing Sheets

ONE GHZ CATV REPEATER STATION

BACKGROUND OF THE INVENTION

1. Field of the Invention

This invention relates to an apparatus for a method of RF amplification of signals up to 1 GHz for CATV repeater stations. Presently available 77 channel CATV RF distribution systems may be converted to 151 channel distribution systems by installing the gain stage of the present invention in place of gain stages utilized in systems up to 550 MHz. The present invention provides a gain stage which is pin for pin compatible with existing gain stages.

2. Description of the Prior Art

Presently available CATV equipment utilizes a frequency spectrum ranging from 50 MHz to 550 MHz. This frequency range enables commercial CATV operators to deliver 77 channels over coaxial networks to cable subscribers. A one GHz CATV amplifier will provide a broader frequency spectrum, enabling CATV transmission of 151 channels over the same systems which are currently delivering 77 channels.

At frequencies above 550 MHz, problems are encountered in the design of circuits because as the frequency increases the size of the components must decrease. The miniaturization of electromagnetic components such as inductors and impedance matching transformers presents a difficult design hurdle. Second harmonic distortion traditionally has been eliminated by means of push-pull amplification. This cancellation process developed first in audio equipment. It is relatively easy to achieve a phase shift of 180° at frequencies below 20 MHz. This is adequate for design purposes in the audio ranges and up to 20 MHz. CATV industry has developed transmissions up to 550 MHz. However, attempts to design a circuit which approaches 180° phase shift at transmission frequencies exceeding 550 MHz, have been unsuccessful. It is desirable though to approach 180° as nearly as possible, which ideally will cancel all distortion due to second and third harmonics and multiples thereof These harmonics are commonly referred to as "2IM" and Composite Triple Beat (CTB). This provides optimal linearity between the input and the output signal of the amplifier.

SUMMARY OF THE INVENTION

In the present invention, a push-pull one-GHz gain stage amplifier is provided, incorporating two-each, two-stage cascode connected transistor amplifiers.

The connection of two gain stage amplifiers through 180° splitters comprises the one GHz gain stage amplifier. Using the one GHz gain stage amplifier, incorporation with the other electronic components to be described as follows, a cable system is provided wherein the linear response range of the system at a controlled output level ranges from 5 MHz to 1 GHz. The one GHz gain stage amplifiers provide the forward gain of the cable system in a range of 50 MHz to 1 GHz, and the reverse amplification of the system provides a frequency range for cable signals of 5 MHz to 30 MHz.

A block diagram is provided to illustrate the components of the repeater station which are explained as follows. A diplex filter receives the incoming signal at the input of the repeater station The high pass portion of the diplex filter permits signals in the range of 50 MHz to 1 GHz to pass through, while rejecting signals of 5 to 30 MHz. At the output of the high pass portion of the diplex filter is connected a resistive attenuator. This attenuator reduces the level of the signal coming out of the filter to the level required for input to the input signal processing equalizer. The input signal processing equalizer is connected at the output terminal of the attenuator. The input signal processing equalizer further reduces the transmission signal from the output of the attenuator, to control the power level at the output of the amplifier. If the amplitude of the input signal to the equalizer is too great, energy is absorbed through the equalizer. The output of the input signal processing equalizer feeds the first of two one GHz gain stages. This first gain stage provides gain and optimizes signal to noise performance. At the output of the amplifier is connected a second equalizer, to tailor the operation of the amplifier and provide a controlled level signal to the next-in-line component, the pin diode attenuator. The pin diode attenuator provides automatic level control of the output signal through a feed back loop. Connected to the output of the pin diode is the second gain stage amplifier. The output of the gain stage amplifier is fed back to the pin diode through first a band pass filter. This filter may be tuned for any one of the 151 channel frequencies. The band-pass filter output feeds to a detector, which detects the amplitude of the signal in the frequency range of the preselected channel. The detector rectifies the signal from the band pass filter and measures the peak amplitude of that signal. The rectified signal is then fed into a DC amplifier. The output of the DC amp is connected to the feed back terminal of the pin diode attenuator. A reduction in the DC amplifier output system causes the pin diode attenuator to reduce its insertion loss. The purpose of the feed back loop in general is to maintain a constant output signal level verses temperature. Ambient temperature changes affect the trunking cable loss which in turn affects the level of the signal input into the amplifier station. The feedback loop helps to maintain constant operating output signal level by adjusting the repeater station gain. At the output of the second gain stage the point common to the input of the band pass filter is connected to the input of the high-pass portion of a second diplex filter. This is connected at the repeater station output to another coaxial cable of a preselected length.

Connected in parallel to the high pass system just described and transmitting signals in the reverse direction, is the low pass portion of the amplifier station. The input to the low pass portion is at the diplex filter at the output of the high pass portion. Signals at lower frequencies, 5 to 30 MHz, are transmitted into the ouput end of the amplifier station to feed signals back to the cable transmission source. Cable system operators commonly utilize this band to obtain information back from cable subscribers, as well as for local programing transmissions. These signals typically may be transmitted back on 5 to 30 MHz carrier waves to the cable transmission source, then transmitted after processing the signal on a carrier wave in the 50 MHz to 1 GHz range.

The repeater station relies on the aforementioned gain stages for its unique broad band linear response up to 1 GHz Previously cable television repeater stations were limited to 77 channels because 50 MHz to 1 GHz gain stage with high enough output capability and with suitable distortion performance were unavailable. The present invention is designed around the gain stage. This gain stage is in the preferred embodiment described hereinafter is capable of thick film hybrid circuit board construction. The gain stage can be in this embodiment manufactured to be pin for pin compatible with various commercially available repeater station amplifying means for 550 MHz transmissions. This effectively permits the cable system operators to nearly double the operational bandwidth and the corresponding number of television channels without wholesale replacement of components along its current distribution network.

These and other objects of the present invention will be more completely disclosed and described in the following specification, the accompanying drawings and the appended claims.

DESCRIPTION OF THE PREFERRED EMBODIMENTS

Figure 1:
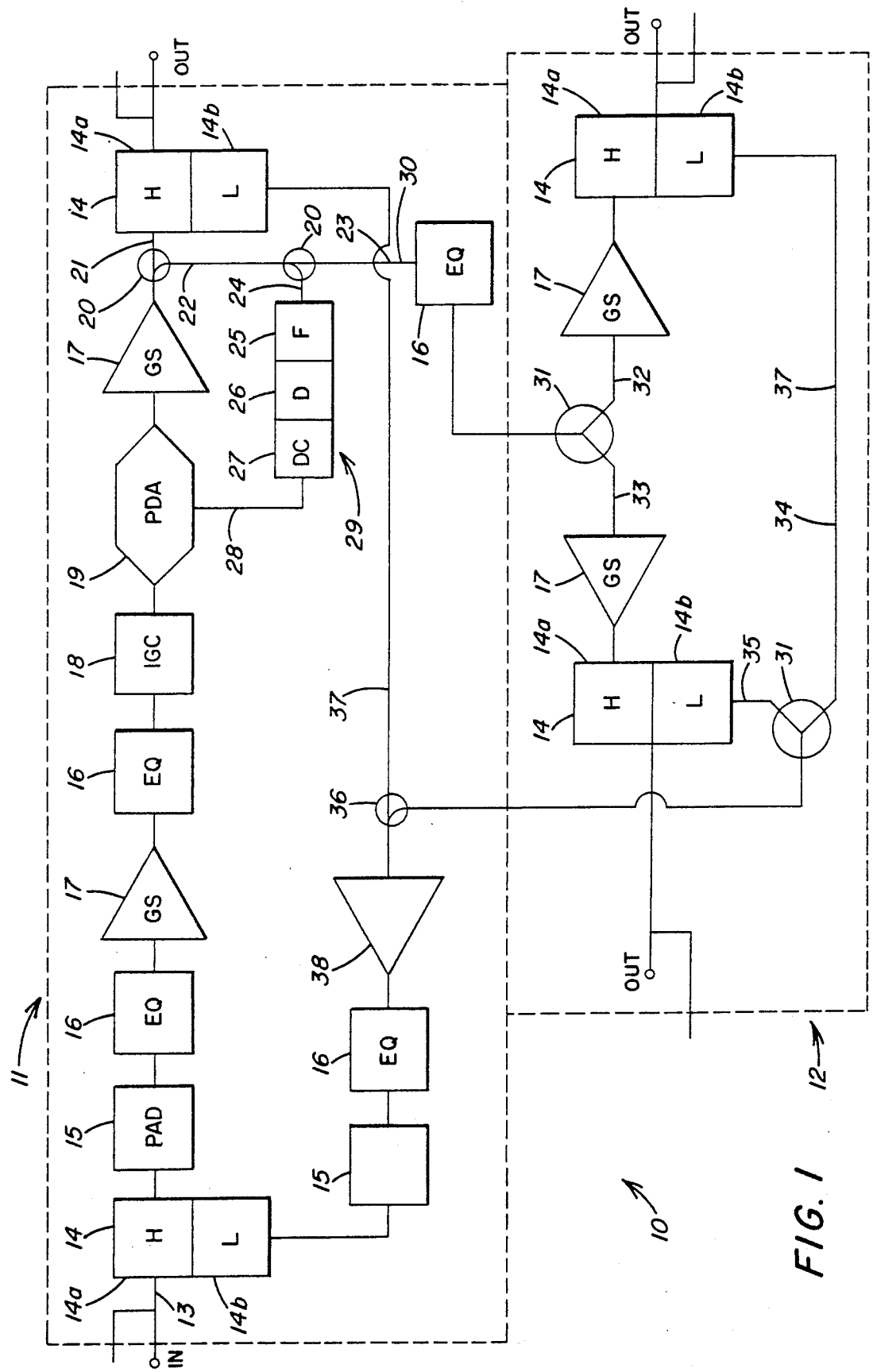
FIG. 1 illustrates the 1 GHz repeater station diagram for connection of coaxial trunking lines transmitting RF signals of 5 MHz to 1 GHz, with cable user distribution outputs.

FIG. 1 illustrates the 1 GHz repeater station 10 diagram for connection of coaxial trunking lines transmitting RF signals of 5 MHz to 1 GHz, with cable user distribution outputs. The 1 GHz repeater station comprises a trunking section 11 and a distribution section 12. The trunking section 11 conditions and boosts a transmission signal along a trunking line 13. Line losses caused by the inherent impedance of the trunking line cause the transmission signal to deteriorate after passing a preselected distance along the trunking line 13. The repeater station restores the transmission signal to a designated level for further distribution.

Transmission signal is impressed upon the input terminal of a diplex filter 14. The diplex filter is made up of a highpass filter 14a and a lowpass filter 14b. The highpass filter allows signals of 50 MHz to 1 GHz to pass through it virtually without attenuation. Signals below 50 MHz are rejected. The lowpass filter 14b its input common to the input of highpass filter 14a. Lowpass filter 14b passes signals from 5 to 30 MHz without attenuation while blocking signals at frequencies over 30 MHz.

The output of highpass filter 14a is common to the input of resistive attenuator 15. Resistive attenuator 15 lowers the level of the input signal within an acceptable tolerance for input to equalizer 16, while dissipating excessive signal energy to a ground. The attenuated signal is equalized to provide sloped loss across the broad spectrum of RF frequency in the equalizer 16. Equalizer 16 may be one of the type commerically available through C-COR, model number EQ-550-7, part number 162172-03. Equalizer 16 causes the signal response of the first gain stage 17 to be flat across the broad band, so as to optimize the repeater station carrier to noise ratio and composite triple beat performance. Equalizer 16 and attenuator 15 also control the output. The signal passes from the output of equalizer 16 to the first gain stage 17. The gain stage 17 amplifies the signal at this point. The amplified signal is then input to an equalizer 16 to tailor the operation of the repeater station to meet special operational requirements. The signal then passes from equalizer 16 to an interstage gain compensator (IGC) 18. The IGC 18 is factory adjusted to compensate for losses associated with manufacturing, such the electrical properties of the repeater station housing, while the IGC 18 also pre-equalizes the second gain stage 17. The output of IGC 18 is fed into the input of pin diode attenuator 19.

The pin diode attenuator insertion loss is determined by its drive voltage which is received from amplifier 27. This is a feed back signal which indicates the level of insertion loss necessary to maintain the proper signal power level at directional coupler 20. Pin diode attenuator reduces attenuation of the signal at its output when the feedback signal detects a signal at directional coupler 20 below an acceptable predetermined power level. Pin diode attenuator 19 varies the amount of attenuation of the signal proportionally with the amount of deviation of signal power level present at directional coupler 20. The variably attenuated signal is then inserted at the second gain stage 17. This gain stage 17 again amplifies the signal to the repeater station output operating level. Gain stage 17 optimally reduces 2IM distortion through cancellation means at output splitter (40). The phase shifting and cancellation of 2IM distortion will be further explained below in the description of the splitter.

The amplified signal at the output of the second gain stage is input to directional coupler 20. Through leg 21 carries the desired output signal to the high pass portion 14a of diplex filter 14. Down leg 22 feeds a second directional coupler with a fraction of the output signal that is indicative of the output power level. Typically, a repeater station taps off 8 db of signal for distribution and transmits 2 db of signal along the trunking line to another repeater station 10.

Down leg 24 of directional coupler 20 directs a fractional portion of the signal present on down leg 22, into the feedback loop 29 that is comprised of filter 25, detector 26 and DC amplifier 27. Filter 25 can be any filter which is tuned for one of 151 channels across the 50 MHz to 1 GHz spectrum The standard NTSC television broadcast channel has an allocated bandwidth of 6 MHz. The filter passes the selected channel video carrier to the input of detector 26. Detector 26 produces a DC signal that is then input to DC amplifier 27. A feedback signal 28 is produced at the output of DC amplifier 27, which drives the pin diode attenuator 19 as described previously. The feedback loop just described provides a means of automatic level control of the output of repeater station 10. Other means of detecting signal level for automatic level control may be employed to achieve a similar result. The preferred embodiment disclosed herein relies on one-channel sampling.

Distribution signal 30 present on through leg 23 is fed into equalizer 16. The output signal of the equalizer 16 is then applied to signal divider 31. Signal divider distributes one half of its input signal to first divider leg 32 and the remaining one half of its input signal to second divider leg 33. Gain stage 17 amplifies the divided signal, which is then fed to high pass portion 14a of diplex filter 14 at each output port of distribution section 12.

There is provided in the upstream direction of repeater station 10 a low frequency amplification means for frequencies of 5 to 30 MHz. Lowpass portion 14b of diplex filter 14 at the output end of repeater station 10 subscriber end of the system. Subscriber signal 37 is fed to signal adder 36 from the lowpass portion 14b of diplex filter 14. Subscriber signal 37 also is supplied to signal adder 36 from distribution section 12 through the output of a signal divider 31. Subscriber signals 37 are combined at signal adder 6 and fed to the input of an amplifier 38. Amplifier 38 may be any number of commerically available amplifiers such as Motorola, Model No. MHW 1184. The output of amplifier 38 is connected to equalizer 16 and the output of equalizer 16 feeds into a resistive attenuator 15 and thence to low pass portion 14b of diplex filter 14 located at the repeater station 10 input.

Figure 2:
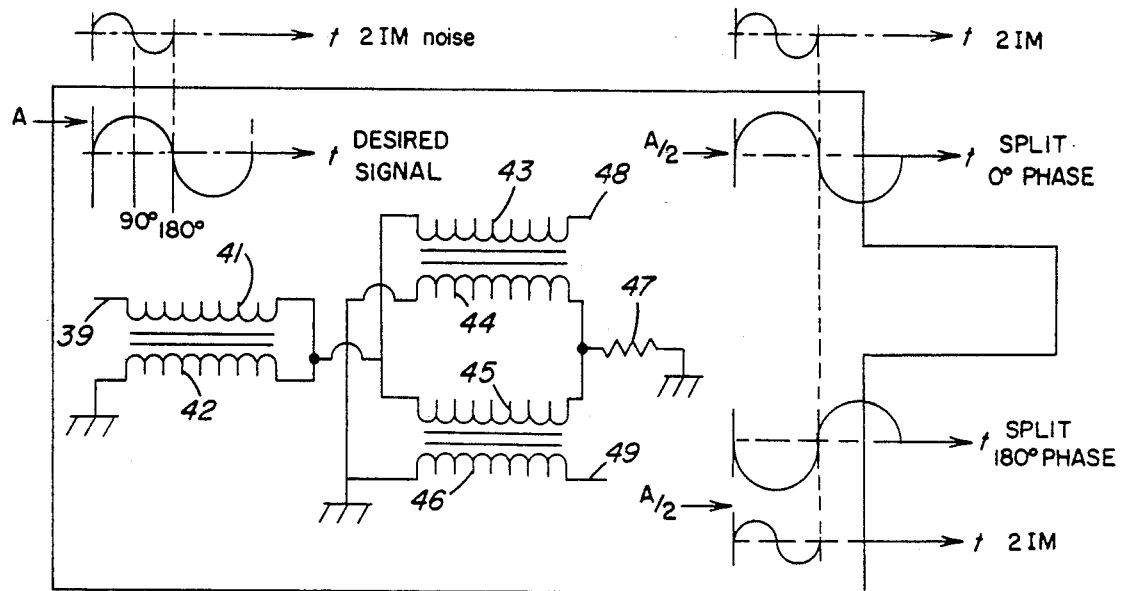
FIG. 2 is a schematic diagram of the 180° splitter utilized at the input and output of gain stage.

FIG. 2 is a schematic diagram of the 180° splitter 40 utilized at the input and output of gain stage 17. Splitter 40 comprises three specially wound ferrite core transformers. The transformers are wound 1:1. Very fine copper wire must be used due to the extreme high frequency of the carrier wave. In the preferred embodiment, 36 gauge copper wire (approximately 0.005 in diameter) is used. The core may be made from nickel-zinc based material or other material of similar electromagnetic properties. The core material which goes into making the splitter are of the type which are commercially available from Fair-rite Products Corp.

The first transformer T'1 has primary winding 41 and secondary winding 42. An RF signal of up to 1 GHz is applied at one terminal of primary winding 41. The remaining terminal of primary winding 41 is common to secondary winding 42, secondary winding 43 of T'2 and primary winding 45 of T'3. The other terminal of T'1 secondary winding is common to ground.

The other terminal of T'3 primary winding 45 is connected to one terminal resistor 47 and T'2 primary winding 44 The other resistor 47 terminal and the other T'2 primary winding 44 terminal are common to ground.

The zero phase terminal 48 is the remaining unconnected terminal of T'2 secondary winding 43 for external connection of splitter 40. The shifted phase terminal 49 is the remaining unconnected terminal of T'3 secondary winding 46 for external connection of splitter 40. The signal which appears at the output external connections 48, 49 when in operation is a sinusoidal carrier wave of frequency up to 1 GHz. The amplitude of the signal at each output terminal 48, 49 is approximately one-half of the amplitude of the input signal appearing at the external connection of T'1 primary winding 41. Zero phase terminal 48 signal is in corresponding phase relationship with input signal at T'1 primary winding 41. Shifted phase terminal 49 signal is in reverse phase in relation to the sinewave signals at the input and at the zero phase output. FIG. 2 also provides graphical illustrations of the phase relationships and the signal amplitudes at each external connection 39, 48 and 49 of the splitter.

Also depicted in FIG. 2 is the 2IM distortion sinewave. The sinewave representing the 2IM distortion is exactly one-half the wave length (hence twice the frequency) of the desired signal. Therefore, when the desired signal is shifted in phase 180°, the corresponding 2IM components are shifted 360°, representing no phase shift of the 2IM signal component. It should be noted that 2IM distortion is developed through the distributed amplifiers 94 connected downstream of the input splitter 40. Therefore, 2IM distortion does not appear at the input splitter 40. The phase relationship is consistent downstream so that for purposes of analysis 2IM theoretically exists at the input.

Phase relationship of the signal input to the splitter 40 with the signal outputs of the splitter 40 is critical to the operation of the amplifier in particular. 2IM distortion at frequencies in excess of 550 MHz is generated in the distributed amplifier 94. When the signal divided at the input signal is recombined at the output splitter, the reverse of the phase relationship analysis applies. The two desired signals appear as inputs to the external connections, zero phase terminal 48 and shifted phase terminal 49. The output signal appearing at T'1 primary winding 43 recombines the signal mathematically as twice the amplitude as they appear on the inputs 48, 49 to output splitter 40. The 2IM components, meanwhile, appear in synchronous phase at the same input terminals of output splitter 40 causing them to appear in reverse phase and identical amplitude, which ideally cancels all of the 2IM distortion. Certain physical limitations inherent to the system componentry will in practice result in imperfect cancellation. However, in the present inventions the resultant distortion is sufficiently minimal so as not to disturb the quality of the transmission signal at the distribution end of the system.

Figure 3:
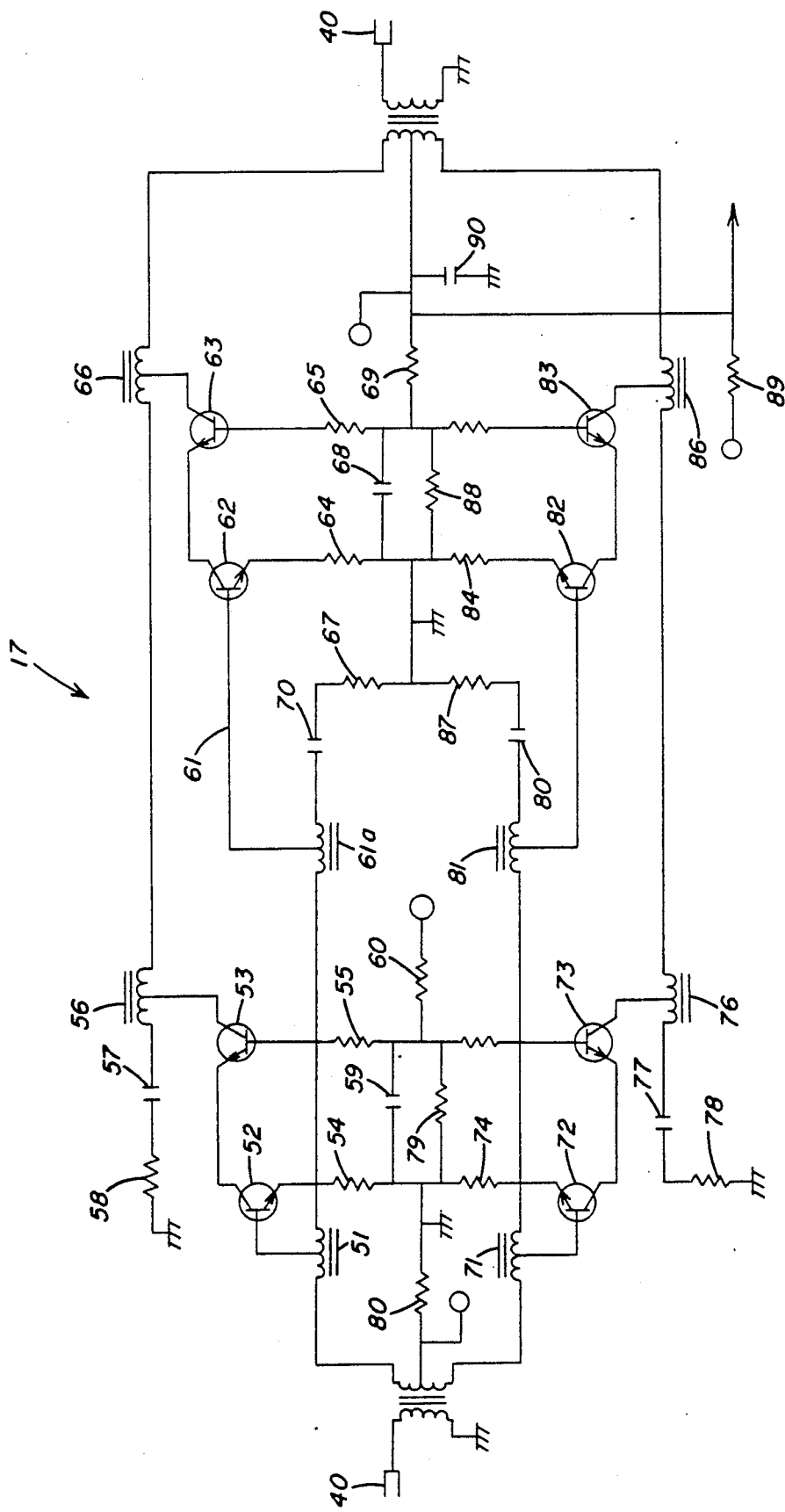
FIG. 3 illustrates one push-pull cascode connected 1 GHz gain stage.

FIG. 3 illustrates one push-pull cascode connected 1 GHz gain stage. A desired signal is applied to the input of a splitter 40. The desired signal appears as two signals of one half the desired signal amplitude at the output terminals 48, 49. The split signals are shifted in phase by 180°. The signals next pass through amplification circuits which are mirror-image symmetrical paths. Transistors in the zero phase path 52, 53 and associated RC circuitry correspond to transistors 72, 73 in the shifted phase signal path, and corresponding RC circuitry. Likewise, transistors 62, 63 reflect the function of transistors 82, 83.

For simplicity, this discussion will follow the zero phase signal path. It will be understood that shifted phase signal processing occurs in substantially identical and simultaneous relationship. The signal at zero phase terminal 48 passes to transmission line 51. Divider leg 51 distributes one half of the signal to base of transistor 52 and one half of the signal to a second transmission line 61. Emitter of transistor 52 is connected to resistor 54. Collector of transistor 52 feeds the desired quarter signal to emitter of transistor 53. Transistor 53 is connected at its base to resistor 55 and collector of transistor 53 feeds to transmission line 56. Transmission line 56 is connected to ground through resistor 58 and capacitor 57. A third terminal of transmission line 56 feeds the desired quarter signal to transmission line 66 where the two split signals are combined.

Divider leg 61a distributes substantially the entire split signal input to transmission line 61 to the base of transistor 62. Emitter of transistor 62 is connected to resistor 64. Collector of transistor 62 feeds the desired quarter signal to emitter of transistor 63. Transistor 63 is connected at its base to resistor 65 and collector of transistor 63 feeds to transmission line 66. Transmission line 66 is connected as described above, so as to combine the desired quarter signals. The output terminal of transmission line 66 is connected to zero phase terminal 48 of splitter 40 at the output. Similarly, the output terminal of transmission line 86 is connected to the shifted phase terminal 49 of splitter 40.

Terminating resistors 58, 67, 78 and 87 are provided for matching 75 ohm resistance of the transmission line. Voltage divider resistors 89, 80 are connected to a 24 volt DC (B+) power supply. An inductor (not shown) may be provided in series with the power supply to prevent bleed off of the desired RF signals.

Resistors 55, 65, 75 and 85 illustrate internal resistance present in commerically available multi-stage transistor amplifier. Resistors 54, 64, 74 and 84 accomplish grounding of the emitters in cascode configuration. Resistors 60, 69, 79, 88 and capacitors 59, 68, provide base bias voltage and RF bypass for the common base transistors 53, 63, 73, 83.

Figure 4:
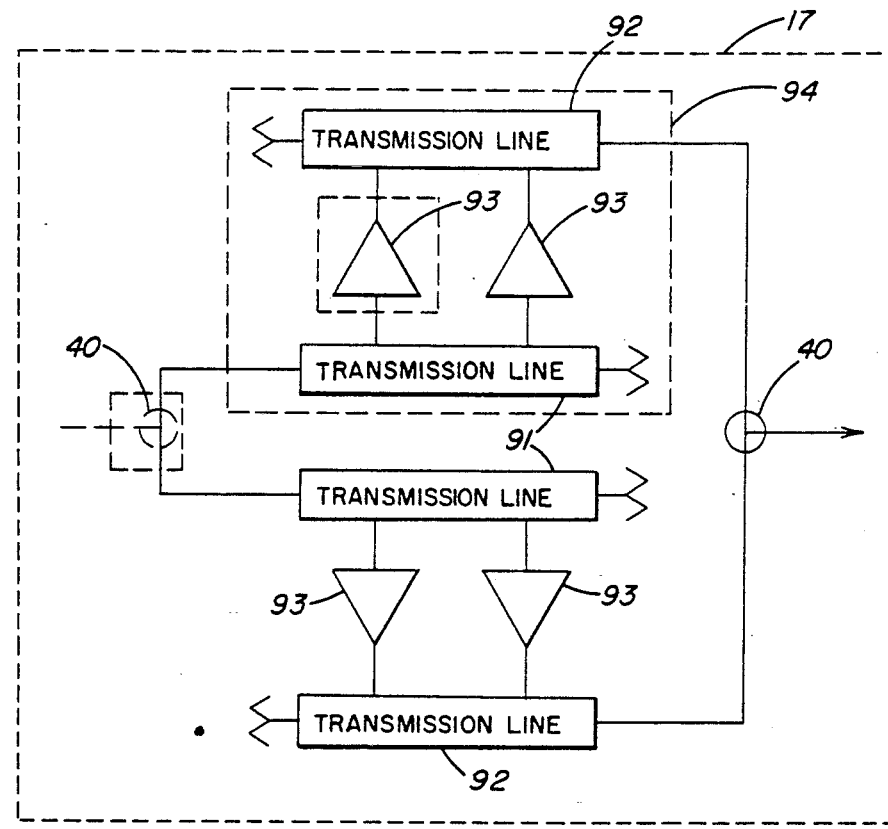
FIG. 4 is a simplified schematic illustration of the gain stage showing the various subcomponents in relationship to each other.

FIG. 4 is a simplified schematic illustration of the gain stage showing the various subcomponents in relationship to each other.

Transmission lines 91 being feed a signal from the input 180° splitter 40, transmit the desired signal to output transmission lines 92 through a pair of distributed amplifiers 93. Each distributed amplifier is a multi-transistor cascode connected amplifier. More specifically, each distributed amplifier has four transistors, which in FIGS. 3 are described as 52, 53; 72, 73; 62, 63; and 82, 83. After as described previously, 2IM beats are generated through the transistors contained in the distributed amplifiers 93. The amplified desired signal present at transmission line 92 contains 2IM distortion. The desired signal and with 2IM distortion is feed into output splitter 40 which combines the desired signal at its output in phase while canceling 2IM distortion present at the splitter 40 input.

Figure 5:
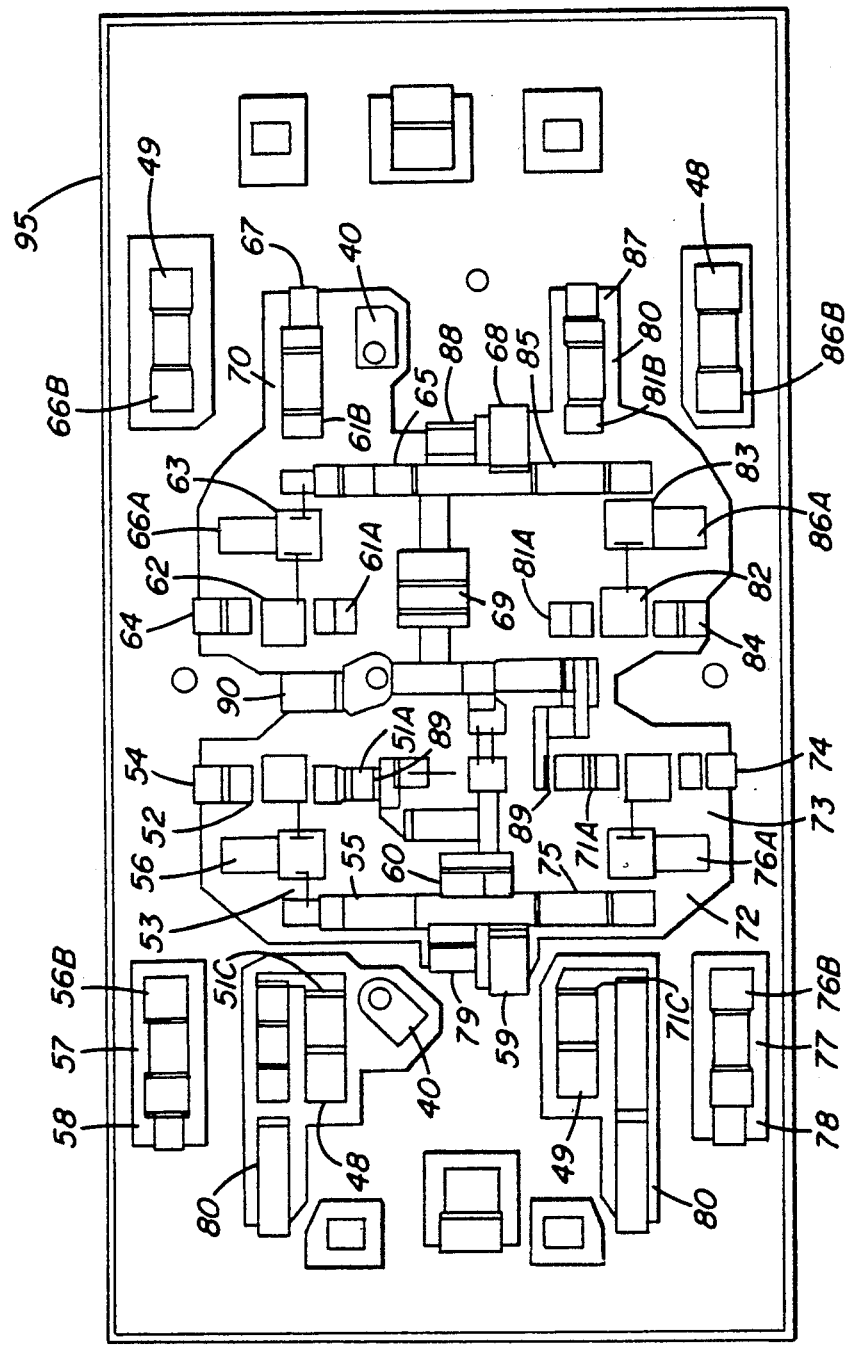
FIG. 5 represents a thick film hybrid with components as described in FIG. 3.

FIG. 5 represents a thick film hybrid circuit board with components as described in FIG. 3. One such thick film hybrid circuit board contains a single gain stage as defined in FIG. 3. Each such gain stage is pin compatible with amplifier circuits currently available in the market for use in circuits of 77 channel CATV transmission. In this preferred embodiment of the invention, a typical gain stage approximately one and five eighths inches by seven eighth inches in plan view.

Other possible embodiments may be constructed through the use of thin film techniques, as well as bread boarding and other wiring techniques known in the industry.

According to the provisions of the Patent Statutes, we have explained the principle, preferred construction and mode of operation of our invention and have illustrated and described what we now consider to represent its best embodiments. However, it should be understood that, within the scope of the appended claims, the invention may be practiced otherwise than as specifically illustrated and described.

We claim:

1. An amplifier circuit for increasing the RF bandwidth of cable television distribution systems to 151 television channels comprising,
    first filtering means for passing signals above a predetermined frequency,
    means for attenuating the output signal of said filtering means,
    equalizing means for providing sloped loss at output of said amplifier circuit,
    amplifying means coupled to said equalizing means output, said amplifying means providing gain across said amplifier circuit while optimizing signal to noise performance of said amplifying circuit,
    second equalizing means for tailoring operation of said amplifier circuit,
    means for compensating for losses due to manufacturing of said amplifier circuit,
    control means for automatically controlling of the signal at the output of said amplifier circuit,
    said control means having a forward path, a feedback path and a feedback signal,
    said forward path having an attenuator, a second amplifying means and a directional coupler,
    said directional coupler having a through leg and a down leg,
    said feedback path having a means for detecting the power level of a signal at said down leg and converting said power level to said feedback signal,
    said attenuator being driven by said feedback signal in proportion to said feedback signal to provide attenuation in said forward path, and
    second filtering means for passing signals above a predetermined frequency.

2. The amplifier circuit as set forth in claim 1 including,
    a second circuit and a third circuit,
    said second circuit having means for equalizing the signal from said directional coupler,
    at least one signal splitter having two divider legs,
    said signal splitter dividing the output signal of said equalizing means of said second circuit,
    distribution amplifying means coupled to said divider legs at the input of said distribution amplifying means,
    output filter connected at the output of each said distribution amplifying means,
    said filters providing separation of high frequency signals and low frequency signals,
    second splitter means for combining said second circuit filter low frequency signals with the low frequency signal of said third circuit,
    said third circuit having a third filtering means at the output of said amplifier circuit for passing signals below a predetermined frequency in reverse direction of said first circuit,
    second directional coupler means for combining the low frequency signals from said second and third circuit at the output of said second splitter means,
    means for providing gain to said combined low frequency signals,
    third equalizing means at the output of said means for providing gain,
    means for attenuating said equalizing means output, and
    fourth filtering means for passing signals below a predetermined frequency to the input of said amplifier circuit.

3. The amplifying circuit of claims 1 or 2, wherein,
    said amplifying means includes a first power splitter for dividing a desired signal, said first power splitter providing equal division of said desired signal and 180° phase shifting of said desired signal,
    a plurality of transmission lines for transmission of said desired signal,
    a plurality of distributed amplifiers,
    said distributed amplifiers each providing gain to said desired signal having a frequency spectrum in the range of 50 MHz to 1 GHz, such that for each pair of said transmission lines a distributed amplifier is connected therebetween,
    a second power splitter for taking said equally divided desired signals in opposing phase relationship, and recombining at output of said splitter in concurring phase and doubling amplitude of said divided signals at the output terminal of said splitter, and said splitter also providing means for cancellation of substantially all 2IM noise distortion at said output terminal of said splitter.

4. The amplifying means of claim 1 or 2, said amplifying means having a pair of distributed amplifiers, each said distributed amplifier having an input transmission line, a pair of cascode circuits, and an output transmission line;

said pair of cascode circuits providing gain to the signal transmitted through to said output transmission line, said input transmission line being interconnected to said output transmission line through said pair of cascode circuits, said pair of cascode circuits being connected in parallel between said input and said output transmission lines, said cascode circuits each having a common emitter, transistor and a common base transistor, said common emitter transistor connected at its collector to emitter of said common base transistor, said transistors being connected to a DC power supply through a resistive network;

said amplifying means also having a pair of power splitters, one of said power splitters dividing the amplitude of the input signal while shifting the phase of the divided signals relative to each other, said power splitter coupling each said divided signal to one of said distributed amplifiers, other said power splitter coupled at the outputs of said distributed amplifiers, said power splitter shifting said divided signals into concurring phase relationship and adding the amplitudes of the divided signals, and said power splitter also causing cancellation of half-wavelength distortion by means of phase shifting.

5. The amplifying means as set forth in claims 1 or 2, wherein, said power splitters is connected at each output terminal to a transmission means having a feed through leg and a divider leg, said divider leg feeding a first transistor having a base, collector and emitter connection, said divider leg feeding a distributed amplifier having a cascode circuit, said cascode circuit having transistor one and transistor two, each said transistor having a base, collector and emitter, said transistor one collector being connected to said transmitter two, said transistor one emitter resistively connected to ground through a resistor and to a bias voltage, said bias voltage also applied through a resistor to said transistor two said base, said transistor two base also being connected through a resistor to a positive bias voltage said positive bias voltage connected to said transistor two collector and through a resistor to said transistor one base;

said distributed amplifier having an output signal present at said transistor two collector, said output signal being connected to a second transmission line divider leg, for transmission on a second transmission line through leg to an input of a second output transmission line, said first transmission line input through leg being connected to a second input transmission line, and said second transmission line having a divider leg, input leg, and a through leg, said second transmission through leg providing a combination of signals present at said second transmission line, divider leg and input leg, said second transmission line through leg being connected to an output splitter, said output splitter having at least two input terminations, and one output termination, one said splitter input termination connected to said second output transmission line, other said splitter input termination being connected to a symmetrically disposed transmission line to a second desired signal transmission path, said second output splitter termination having a desired signal, said desired signal at said second output splitter termination being in reverse through phase relationship and equal amplitude to a signal present at said first output splitter termination.

6. The amplifying means as set forth in claims 3 or 4 including, said amplifying means having a substrate, said substrate having a plurality of conductive external connection points, an insulating means, a heat sink, said substrate being connected in thermally conductive relationship to said heat sink with said insulating means maintaining electrical isolation from said heat sink, and said heat sink having means for mountably affixing to a weather proof aluminum housing, said housing being capable of fixedly connecting a plurality of coaxial transmission cables and capable of mounting in aerial suspension along coaxial transmission line.

7. The amplifying means as set forth in claims 3 or 4 wherein, said power splitter having means for dividing the amplitude of an RF input signal into two subsignals, said subsignals each having an amplitude of one half the amplitude of said input signal, means for phase shifting said divided subsignals by approximately 180°, and means for cancelling distortion signals of substantially one half the RF wavelength of said divided subsignals.

8. The amplifying means as set forth in claims 3, 4 or 5 including, said power splitter having a first transformer, a second transformer, a third transformer and a resistor, said resistor having a first resistor terminal and a second resistor terminal, each of said transformers having first and second primary terminals and first and second secondary terminals, said first transformer having a common point of connection between said second primary terminal and said first secondary terminal of said first transformer, said first transformer second secondary terminal being connected to ground, said second transformer first secondary terminal being connected to said first transformer common point, said second transformer second secondary terminal being provided to an external connection for deriving the second transformer signal, said second transformer first primary terminal being connected to said first resistor terminal, said first resistor terminal being also connected to said third transformer first primary terminal, said second resistor being connected to ground, said second resistor providing balance between signal division of said power splitter, said second transformer second primary winding being connected to ground, said third transformer second primary terminal being connected to said first transformer common point, said third transformer first secondary terminal being provided to a point for external connection for deriving the third transformer signal, said third transformer second secondary terminal being connected to ground such that a desired signal when applied to first transformer first primary terminal appears as two divided signals at the external connection points of said second and third transformers, said second transformer external signal being in concurring phase relationship and one half amplitude as compared to the desired signal, and said third transformer external signal being in reverse phase relationship and equal in amplitude with respect to said second transformer external signal while distortion waves one half wavelength of the desired signal present at external connections of said second and third transformers are cancelled within said power splitter.

9. A method of distributing 151 television channels across a frequency spectrum ranging from 50 MHz to 1 GHz comprising the steps of, transmitting television channels along sections of a coaxial trunking line carrying a diminished signal, splitting the diminished signal by first splitter means into a pair of signals, feeding the pair of signals to a pair of distributed amplifiers to generate a pair of amplified signals shifted in phase and having a frequency spectrum in the range of 50 MHz to 1 GHz, feeding the pair of amplified signals shifted in phase to second splitter means for combining the amplified signals in phase and cancelling harmonic distortion from the amplified signals to form a resultant amplified signal free of distortion, distributing a portion of the resultant amplified signal to subscribers, and retransmitting said television channels to a next section of trunking line.

10. The method as set forth in claim 9 wherein, providing said 151 television channel capability with a hybrid amplifying circuit, replacing a 77 television channel amplifier circuit with said 151 television channel amplifier circuit, and utilizing a pin for pin compatible replacement hybrid amplifying circuit.

11. A method as set forth in claim 9 which includes, filtering from the trunking line a signal at a frequency in the range of 50 MHz to 1 GHz, and passing to the first splitter means a transmission signal at a frequency in the range of 50 MHz to 1 GHz.

12. A method as set forth in claim 11 which includes, attenuating the filtered signal form the trunking line to a preselected level of amplitude, detecting a loss in the amplitude of the attenuated signal, and amplifying the attenuated signal in the event of a loss in the power level thereof to maintain the signal at a preselected level of amplitude.

13. A method as set forth in claim 9 which includes, splitting the signal into the pair of signals generating a first signal at zero phase and a second signal shifted 180° in phase from the first signal where the first and second signals contain components of harmonic distortion shifted in phase, and recombining the first and second signals to cancel out the components of harmonic distortion shifted in phase.

14. A method as set forth in claim 13 which includes, generating a resultant signal amplified at twice the amplitude of the first and second signals and free of harmonic distortion.

15. A repeater station for connection to a CATV coaxial trunking line comprising, conditioning means connected to a coaxial trunking line for receiving a CATV transmission signal and restoring the transmission signal to a preselected power level, said conditioning means having an input terminal connected to the trunking line and an output terminal, input signal splitting means connected to said conditioning means output terminal for receiving the transmission signal restored to a preselected power level, said input signal splitting means having a pair of output terminals for generating a pair of output signals where each output signal has an amplitude equal to one half the amplitude of the transmission signal supplied to said input signal splitting means and said output signals shifted in phase by 180°, amplifier means connected to said output terminals of said input signal splitting mans for receiving said output signals and generating a pair of amplified signals shifted in phase by 180° and containing harmonic distortion, and output signal splitting means connected to said amplifier means for receiving said pair of amplified signals shifted in phase to combine said pair of amplified signals and cancel the harmonic distortion therefrom to generate a resultant amplified signal free of distortion.

16. A repeater station as set forth in claim 15 in which, said conditioning means includes filter means for passing to said output terminal the transmission signal at a frequency in the range of 50 MHz to 1 GHz while rejecting from said output terminal the transmission signal at a frequency below 50 MHz.

17. A repeater station as set forth in claim 15 in which, said conditioning means includes amplifier means for maintaining the transmission signal at a preselected amplitude level in response to a reduction in the amplitude of the transmission signal below said preselected amplitude level.

18. A repeater station as set forth in claim 17 which includes, feed back means connected to said amplifier means for maintaining a constant amplitude of the transmission signal transmitted from said amplifier means in response to insertion losses of the transmission signal.

19. A repeater station as set forth in claim 15 in which,
said input signal splitting means includes a plurality of transformers connected to receive the transmission signal and divide the transmission signal into said pair of output signals,
a first transformer having a zero phase output terminal for supplying one of said output signals at zero phase, and
a second transformer having a shifted phase output terminal for supplying the other of said output signals shifted 180° in phase from the signal supplied at said zero phase output terminal.

20. A repeater station as set forth in claim 19 in which,
said output signal splitting means includes means for recombining said signals containing harmonic distortion components at zero phase and shifted 180° in phase to generate said resultant signal in phase with said harmonic distortion components appearing in reverse phase and have identical amplitude such that said harmonic distortion components cancel one another to generate said resultant signal at twice the amplitude of said output signals form said first and second transformers.

* * * * *